United States Patent [19]

Jin

[11] Patent Number: 5,382,314
[45] Date of Patent: Jan. 17, 1995

[54] METHOD OF SHAPING A DIAMOND BODY

[75] Inventor: Sungho Jin, Millington, N.J.

[73] Assignee: AT&T Corp., Murray Hill, N.J.

[21] Appl. No.: 114,704

[22] Filed: Aug. 31, 1993

[51] Int. Cl.$^6$ .......................................... H01L 21/00
[52] U.S. Cl. ...................... 156/628; 156/60; 156/625; 156/659.1
[58] Field of Search ............... 156/625, 628, 650, 629, 156/60, 659.1

[56] References Cited

PUBLICATIONS

"Classification of Phase Diagrams of Metal-Carbon Systems in Relation to Diamond Synthesis"; Butylenko et al.; 1977; Sint, Almazy (4), 9-13; abstract only.

Primary Examiner—R. Bruce Breneman
Assistant Examiner—George Goudreau
Attorney, Agent, or Firm—Eugen E. Pacher

[57] ABSTRACT

The disclosed method of shaping a diamond body, typically a polycrystalline diamond (PCD) wafer or film, involves forming a, typically patterned, layer of an "etch-retarding" material on a surface of the diamond body, followed by etching with an appropriate etchant (e.g., molten Ce). Etch-retarding materials are selected from the materials that have low (typically less than 5%) mutual solubility with the etchant at the processing temperature, and that essentially do not form an intermetallic compound with the etchant at the processing temperature. Among etch-retarding materials are Ag, Ca, Mg, Cr, Mo, W, V, Nb, Ta, Ti, Zr, Hf, B, P, and alloys thereof, as well as ceramics such as oxides, nitrides, carbides and borides, e.g., $WO_2$, $TiO_2$, MoC, TiC, $Fe_4N$, ZrN, MoN, $CeB_6$ and $Mo_2B$. The etch-retarding material typically will be of appropriately chosen, non-uniform thickness, with the thickness at a given point depending on the amount of diamond material that is to be removed at that point. The disclosed method has wide applicability, e.g., for correcting thickness variations or curvature of PCD films.

9 Claims, 2 Drawing Sheets

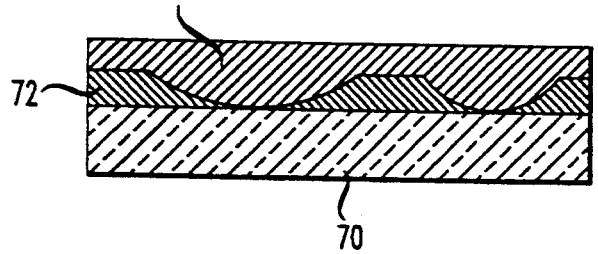
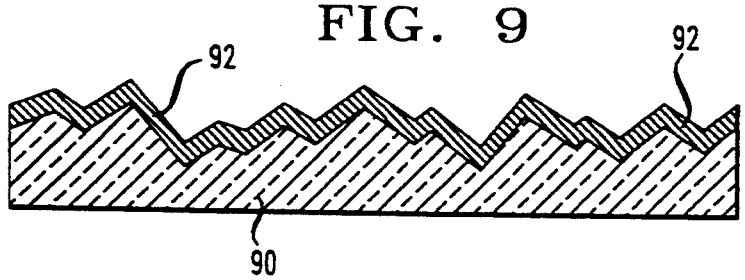
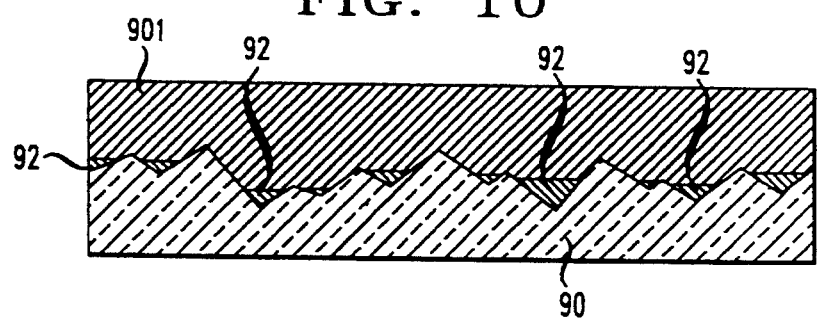
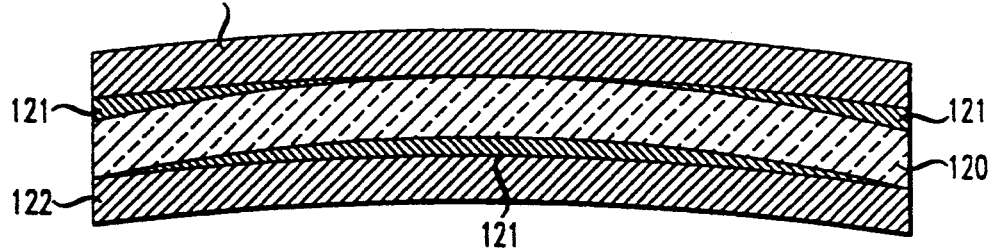

METHOD OF SHAPING A DIAMOND BODY

FIELD OF THE INVENTION

This invention pertains to the field of shaping diamond bodies, typically polycrystalline diamond films or wafers.

BACKGROUND OF THE INVENTION

Until recently, no efficient method of removing material from a polycrystalline diamond film was known. See, for instance, the article by W. van Enckevort in *Physics World*, August 1992, pp. 22–23.

Very recently, such methods were discovered. One approach involves providing for intimate contact at elevated temperature between the diamond film and a solid metal (e.g., Mn, Fe, Ni, Ti) body or powder. See, for instance, S. Jin et al., *Diamond and Related Materials*, Vol. 2, pp. 1038–1042, S. Jin et al., *Applied Physics Letters*, Vol. 60 (16), pp. 1948–1950, and U.S. patent application Ser. No. 07/822,470, filed Jan. 17, 1992. Another approach involves contacting, at elevator temperature, the diamond film with a molten rare earth metal (e.g., Y, La, Ce). See, for instance, S. Jin et al., *Nature*, Vol. 362, Apr. 29, 1993, pp. 822–824, and U.S. patent application Ser. No. 07/908,130, filed Jul. 2, 1992. U.S. Pat. No. 5,328,550, filed Oct. 2, 1992, discloses use of a molten rare metal alloy to effect the material removal at lower temperature, and U.S. patent application Ser. No. 08/038,370, filed Mar. 29, 1993, discloses a technique for selective material removal from the surface of polycrystalline diamond film produce, e.g., a region of lenticular shape. All the above methods are believed to involve diffusion of carbon atoms into the hot metal, the "etchant". The above cited commonly owned U.S. applications are incorporated herein by reference.

Polycrystalline diamond (PCD) film is typically produced by chemical vapor deposition on a substrate. It is frequently observed that the resulting PCD film ("wafer") is not of constant thickness and/or is not flat. Observed variations are frequently as large as ±5% over the water, with the central region of the wafer typically having maximum thickness. For many technological applications of PCD bodies it is typically required that the bodies be of a predetermined thickness and/or be flat, within relatively narrow limits. For instance, use of thin PCD bodies as heat spreaders in laser/optical fiber packages requires that the thickness and flatness be closely controlled. However, provision of flat PCD bodies of predetermined thickness is at best difficult if the starting product (namely, the PCD film on the wafer) has curvature and/or has substantial thickness variation. Thus, a method material removal from PCD film that can be used to substantially eliminate curvature and/or thickness variations over a relatively large area (typically tens of square centimeters) would be of considerable interest. This application discloses such a method.

Known diffusional methods of material removal cannot be applied efficiently to the solution of the above described problem since, in most cases, they result in uniform removal over the contacted surface. The method of the '370 application does not readily lend itself to non-uniform material removal over a relatively large region. Of course, conventional methods (e.g., polishing) would be unacceptably time consuming and costly, and would allow treatment of at most a few wafers at a time.

BRIEF DESCRIPTION OF THE DRAWINGS

FIGS. 1–3, 5, 7 and 12 schematically depict exemplary embodiments of the inventive PCD shaping technique;

FIGS. 4, 6 and 8 show schematically the shaped PCD bodies that result from the techniques of FIGS. 3, 5 and 7, respectively; and FIGS. 9–11 schematically show stages in a further PCD shaping technique according to the invention that can result in substantial smoothing of a faceted PCD surface.

The drawings are not intended to be to scale or proportional.

THE INVENTION

In a broad aspect the invention is embodied in a process of selective removal of diamond material from a diamond body, exemplary a PCD film. The process can result in removal of a predetermined quantity of material at a predetermined location on the body, with the removed quantity typically depending on the location. The method is advantageously used to, for instance, process PCD wafers having curvature and/or non-uniform thickness such that substantially flat PCD wafers of substantially uniform thickness result. A significant aspect of the embodiment is the discovery of etch-retarding materials, and the discovery that the degree of removal of diamond material at a given location on a diamond body depends, inter alia, on the thickness of an etch-retarding material interposed between the diamond body and the etchant at the given location.

Figure 1:
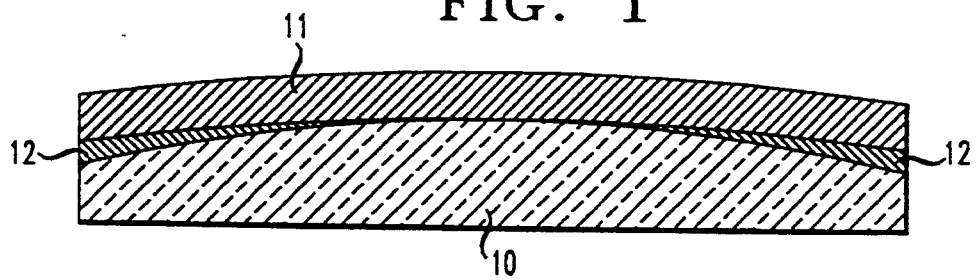

FIG. 1 schematically depicts an exemplary embodiment of the invention, wherein numeral 10 designates a PCD body of non-uniform thickness, 11 designates liquid metal (e.g., Ce) etchant, and 12 designates an etch-retarding metal (e.g., Mo) of appropriately chosen non-uniform thickness. Maintenance of the combination of FIG. 1 at elevated temperature for an appropriate period of time can result (after removal of etch-retarding material, reaction product and unreacted etchant) in a PCD body of substantially uniform thickness.

Figure 2:
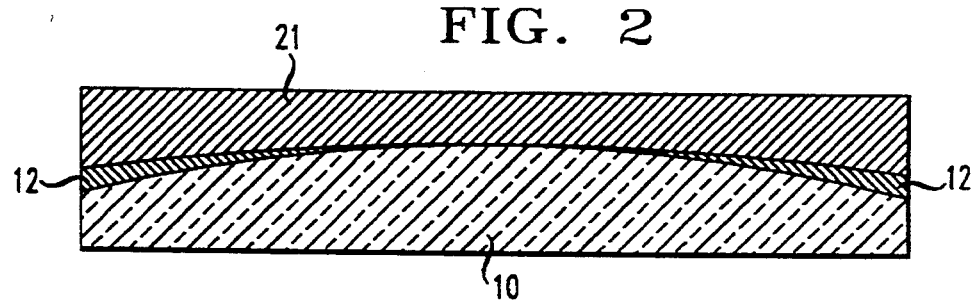

FIG. 2 schematically shows a further embodiment, wherein 21 is an appropriate solid metal (e.g., Fe) etchant film or powder in intimate contact with the etch-retarding material (e.g., Ag) and the PCD body.

Figure 3:
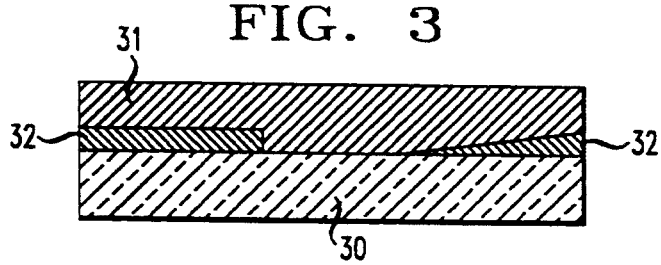
Figure 4:
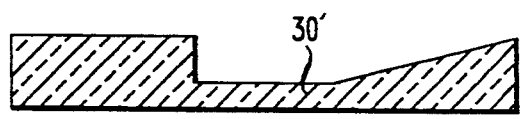

The inventive method is not limited to removing undesired thickness variations, and FIGS. 3 and 4 schematically show creation of a shaped PCD body 30' from PCD body 30. Numeral 31 refers to a molten rare earth (e.g., La) film, and 32 to appropriately shaped etch-retarding material (e.g., Mo or other refractory metal).

Figure 5:
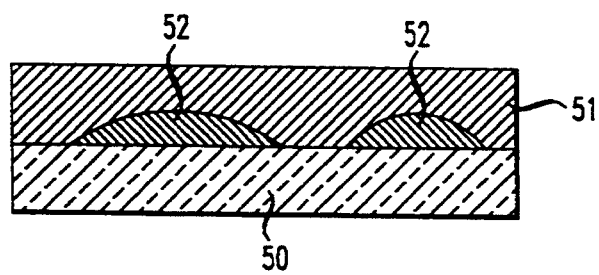
Figure 6:

FIGS. 5 and 6 exemplify formation of a PCD body 50' with convex lenticular surface features from a PCD body 50 of uniform thickness. Numeral 51 designates an appropriate etchant (e.g., a molten rare earth/metal alloy), and 52 designates appropriately shaped etch retarding metal bodies. FIGS. 7 and 8 illustrate formation of a PCD body 70' with concave lenticular surface features from uniform thickness PCD body 70. Numeral 71 refers to the etchant layer, and 72 to the appropriately shaped etch-retarding metal layer.

FIGS. 9–11 illustrate a further application of the inventive method, namely, smoothing the faceted surface of a PCD body 90. Numeral 92 refers to a layer of etch-retarding material of substantially constant thickness deposited (e.g., by evaporation) on the faceted surface of 90. After substantial removal of the etch-retarding metal from the "peaks" of the surface (e.g., by means of emery paper or polishing cloth), the surface is contacted with etchant 101 (e.g., molten Ce). Numeral 90' refers to the resulting PCD body having a substantially smoother surface.

FIG. 12 schematically shows a further exemplary embodiment, wherein numeral 120 refers to a PCD body having substantially constant thickness but undesirable curvature, numerals 121 refer to etch retarding material of appropriately chosen non-constant thickness, and numerals 122 refer to etchant, e.g., thin layers of molten Ce. Those skilled in the art will appreciate that a PCD body that exhibits both curvature and non-uniform thickness can be processed by combining, for instance, the approaches of FIGS. 1 and 12.

It will be appreciated that shaping according to the invention frequently can be advantageously combined with a conventional mechanical, laser or other polishing step, to further improve surface quality.

Among the contemplated etchants are all the etchants disclosed in the above referenced patent applications. They include (solid, powdered, molten or partially molten) Mn, Fe, Ni and Ti, rare earths (Y and the lanthanides) and rare earth/metal alloys. The metal (or metals) in the latter is selected to result in a lower melting point of the alloy than the melting point of the rare earth. Exemplary metals are Ni, Cu, Co, Al and Ag. The etchant deskably is in intimate contact with the PCD surface to be etched, and with the etch-retarding material. The intimate contact automatically results if the etchant is a liquid. If the etchant is a solid, then intimate contact can be achieved, for instance, by depositing the etchant on the surface (e.g., by electrolytic or plasma spray means), or by urging the etchant against the surface, e.g., by application of appropriate force.

Exemplarily, thin sheets of a rare earth metal may be sandwiched between PCD bodies that are partially covered with etch-retardant material, and the resulting diamond/rare earth/diamond/ . . . stack heated to melt the rare earth foils. Alternatively, the partially covered PCD bodies may be immersed into a quantity of molten rare earth.

Among the contemplated etch retarding materials are the materials (frequently metals) that have the special characteristic of small (typically less than 5, preferably less than 2, atomic percent) mutual solubility, as well as no intermetallic compound formation, with a given etchant at the processing temperature. These include Ag and silver alloys, Ca and Ca alloys, and Mg and Mg alloys in the case of (solid, partially or completely molten or powdered) Fe, and refractory metals (selected from group 6B, 5B and 4B of the periodic table, e.g., Cr, Mo, W, V, Nb, Ta, Ti, Zr, Hf and their alloys) or Ca, Mg and their alloys in the case of (solid, partially or completely molten or powdered) rare earth and rare earth/metal etchants. In the case of (solid, partially or completely molten, or powdered) Mn etchant, Ca or Mg can be used as etch-retarding material with W, Zr, B and P being possible but less preferred etch-retarding materials for Mn.

Among the possible etch retarding materials are also ceramics such as oxides, nitrides, carbides and borides. Exemplary are $Al_2O_3$, $WO_2$, $TiO_2$, $MoC$, $TiC$, $Fe_4N$, $ZrN$, $MoN$, $CeB_6$, and $Mo_2B$. Rare earth oxides such as La or Ce oxide may also be used as etch retarding material. Typically, the ceramic etch retarding layer is attacked relatively slowly by the etchant. Since rare earth oxides are typically more stable with respect to molten rare earth etchant than other etch retarding materials, rare earth oxide layers will typically be thinner than other etch retarding layers, or will possibly be porous.

By "mutual solubility" I mean herein the dissolution of etch-retarding material in etchant metal, or vice versa, during the etching period at the etch temperature. Such dissolution, if it occurs, will typically be either through solid state diffusion or through liquid phase transport into the host metal. The etch-retarding material may be elemental, or may contain minor amounts (totallying typically less than 20 atomic percent) of alloying additions. Such additions may serve, for instance, to tailor the melting point and the optimum processing temperature, to tailor the dissolution rate, or to provide a porous etch retarding film. The latter typically involves material that contains two or more phases with differing dissolution rates.

The degree of retardation of diamond etching by an etch retarding material is directly related to the thickness of the retarding material, with a thin film resulting in relatively little retardation, a thicker film resulting in relatively more retardation, and a very thick film essentially completely preventing removal of diamond material. However, the effectiveness of a given etch-retarding material will typically depend on, e.g., the etchant as well as the temperature and duration of the heat treatment. Those skilled in the art will be readily able to determine, from available phase diagrams and by simple preliminary etching experiments, an appropriate etch-retarding material/etchant combination, as well as the amount of diamond removal at a given temperature and for a given etch time. Exemplarily, these preliminary experiments will involve determination of the amount of diamond removal as a function of etch-retarding material thickness. In the case of a porous etch retarding film, the degree and/or rate of etching will typically also depend on the porosity of the film.

The etch-retarding material may be deposited by any appropriate technique. Exemplary are physical deposition techniques such as sputtering, evaporation, molecular beam epitaxy, plasma spraying; chemical deposition techniques such as decomposition of organo-metallic compounds; and electroless or electrolytic deposition, or a combination thereof.

Ceramic etch retarding material may be applied by, e.g., RF sputtering or electroplating. Alternatively, a metal layer may be deposited, followed by conversion of the metal into ceramic by oxidation, nitriding, carburizing, etc.

The etch-retarding material will typically be in the form of a patterned layer, frequently of non-uniform thickness. Patterning can be by any appropriate technique, e.g., photolithography and etching, or deposition through a shadow mask. Non-uniform thickness can be produced through choice of deposition conditions (e.g., off-center placement of the deposition source, angle deposition, use of shutters), or subtractively (e.g., using selective chemical etch or a gradient etch). Such techniques are known to those skilled in the art. The thickness variation will frequently be gradual, but may be substantially stepwise. The thickness of etch-retarding material will typically be less than 100 $\mu$m. In exemplary embodiments whose purpose it is to eliminate or reduce the thickness variation of a PCD wafer. the thickness of the etch-retarding material will typically vary smoothly from substantially zero to a value between about 1 μm and about 10 μm, with the thicker portion of the etch-retarding film overlying the thinner portion of the PCD wafer.

The etching will typically involve treatment at a temperature in the range 300°–1200° C. for a period less than 1000 hours, preferably 500°–1000° for a period in the range 0.1–50 hours. The treatment advantageously is in a non-oxidizing (e.g., Ar, He, $N_2$) or reducing (e.g., $H_2$ or $H_2+$ inert gas) atmosphere. After completion of the diffusional etching, reacted and/or unreacted materials (both from etchant and from etch-retarding material) are advantageously removed from the PCD body by, e.g., chemical etching. Subsequently, the surface of the PCD body may, if desired, be polished by conventional means to achieve a yet smoother surface.

The above described shaping technique is not limited to PCD bodies but can also be applied to single crystal diamond. However, since shaping of single crystal diamond is generally less problematical than shaping of PCD diamond, use of the inventive technique with single crystal diamond is likely to be of less commercial interest.

The shaping technique can advantageously be applied to batch processing of a multiplicity of diamond bodies, typically PCD films or wafers. Exemplarily, after depositing on each of the bodies an appropriately patterned and shaped etch-retarding film (and, possibly, masking a portion of the surface), a stack of diamond bodies is formed, with rare earth foil between the bodies, and the stack is heated to the processing temperature. Those skilled in the art will appreciate that the possibility of batch processing is a significant advantage.

After completion of etching, residue removal (and possibly polishing), the diamond body will typically be divided into a multiplicity of diamond chips that can be used in a variety of applications. Exemplarily, such a diamond chip is bonded to a heat sink (e.g., a copper stud), and a semiconductor laser, LED or other optoelectronic device or component is mounted on the chip, with the chip serving as heat spreader. Such an arrangement is advantageously used, for instance, in an optical fiber transmitter. Diamond bodies produced according to the invention can also be used, e.g, in conjunction with high power electronic devices or components, as passive optical components (e.g., lenses), X-ray windows, infrared windows, grinding or cutting tools, or active electronic devices.

EXAMPLE 1

A (598 μm thick) PCD plate was etched by placing a 250 μm thick Ce foil onto the surface of the plate, and maintaining the combination at 920° C. for 4 hours in argon. After cool down the reacted and unreacted Ce was removed by acid etching and the thickness of the diamond plate was measured. It was reduced by about 56 μm from the starting value.

EXAMPLE 2

On a further PCD plate (substantially as used in Example 1) was sputter deposited a Mo layer of (uniform) approximate thickness 1 μm, and subjected to the Ce-etching heat treatment and cleaning treatment of Example 1. The thickness of the PCD plate was reduced by only about 9 μm, establishing the effectiveness of Mo as an etch-retarding material, and the degree of retardation for the recited particular combination of parameters.

EXAMPLE 3

A PCD plate was etched substantially as described in Example 1, except that a 300 μm La foil was used, and the combination was maintained at 920° C. for 4 hours. The thickness of the plate was reduced by about 31 μm.

EXAMPLE 4

A PCD plate was treated substantially as described in Example 3, except that a 0.2 μm Mo layer was sputter deposited onto the surface of the diamond plate. The treatment reduced the thickness of the plate by only about 15 μm. This further establishes the effectiveness of Mo as an etch-retardant material, and the degree of retardation for a further combination of parameters.

EXAMPLE 5

A PCD body (2 cm wide, 10 cm long), with thickness varying substantially uniformly from 200 μm at one end to about 250 μm at the other end, is coated with a Mo film by off-center sputtering. The Mo film varies in thickness substantially uniformly from 0.1 μm to 2 μm, with the thicker portion of the film overlying the thinner portion of the PCD body. The Mo-covered side of the combination is contacted with molten Ce at 940° C. for 8 hours in Ar. The resulting PCD body, after acid cleaning, has substantially uniform thickness of about 200 μm, with less than 10 μm variation.

I claim:

1. Method of making an article that comprises a processed diamond body, the method comprising
   a) providing a starting diamond body having a major surface; and transforming the starting body into the processed body by a process that comprises
   b) removing a quantity of diamond material from at least a portion of the major surface of said starting body;

CHARACTERIZED IN THAT step b) comprises
   i) forming on at least one portion of the major surface of the starting body a layer of etch-retardant material of non-uniform, thickness; and
   ii) contacting at least a part of said layer of etch-retardant material with etchant at a processing temperature and for a processing time effective for removal of said quantity of diamond material, wherein said etch-retarding material is selected from the materials that have less than 5 atomic percent mutual solubility with diamond and do not form an intermetallic compound with said etchant at said temperature.

2. Method of claim 1, wherein the starting diamond body is a polycrystalline diamond body.

3. Method of claim 1 comprising providing an etchant from the group consisting of Mn, Fe, Ni, Ti, Y, the lanthanide rare earths, and alloys thereof.

4. Method of claim 3, wherein the etchant is molten or partially molten.

5. Method of claim 1, wherein the etch-retarding material is selected from the group consisting of Ag, Ca, Mg, Cr, Mo, W, V, Nb, Ta, Ti, Zr, Hf, B and P, and alloys thereof.

6. Method of claim 1, wherein the etch retarding material is a ceramic selected from the group consisting of oxides, nitrides, carbides and borides.

7. Method of claim 1, wherein the processing temperature is in the range 500°–1000° C., and the processing time is in the range 0.1–50 hours.

8. Method of claim 2, comprising providing a multiplicity of starting diamond bodies, and simultaneously removing a quantity of diamond material from each starting body according to the method of claim 1.

9. Method of claim 2, further comprising mounting a semiconductor laser or light emitting diode on the processed diamond body.

* * * * *